(12) United States Patent
Singh et al.

(10) Patent No.: US 10,788,551 B2
(45) Date of Patent: Sep. 29, 2020

(54) SYNCHRONIZED CONTROL OF POWER SUPPLY AND GRADIENT AMPLIFIER IN MRI SYSTEMS

(71) Applicant: General Electric Company, Schenectady, NY (US)

(72) Inventors: Yash Veer Singh, Niskayuna, NY (US); Ruxi Wang, Cohoes, NY (US); Juan Antonio Sabate, Wilton, NY (US); Kanakasabai Viswanathan, Bangalore (IN)

(73) Assignee: General Electric Company, Schenectady, NY (US)

( * ) Notice: Subject to any disclaimer, the term of this patent is extended or adjusted under 35 U.S.C. 154(b) by 241 days.

(21) Appl. No.: 15/993,363

(22) Filed: May 30, 2018

(65) Prior Publication Data

US 2019/0369182 A1 Dec. 5, 2019

(51) Int. Cl.
*G01R 33/385* (2006.01)
*G01R 33/54* (2006.01)

(52) U.S. Cl.
CPC ....... *G01R 33/3852* (2013.01); *G01R 33/543* (2013.01)

(58) Field of Classification Search
CPC .......................... G01R 33/3852; G01R 33/543
See application file for complete search history.

(56) References Cited

U.S. PATENT DOCUMENTS

| | | | |
|---|---|---|---|
| 5,270,657 A | 12/1993 | Wirth et al. | |
| 6,323,649 B1 | 11/2001 | Pace et al. | |
| 6,552,448 B1 | 4/2003 | Gegner et al. | |
| 7,432,709 B2 | 10/2008 | Schulz et al. | |
| 7,932,693 B2 * | 4/2011 | Lee | H02M 7/53875 318/701 |
| 8,334,697 B2 | 12/2012 | Overweg et al. | |
| 9,853,570 B2 * | 12/2017 | Maly | B60L 3/003 |
| 2007/0007929 A1 * | 1/2007 | Lee | H02M 7/53875 318/802 |
| 2015/0054509 A1 | 2/2015 | Smits et al. | |
| 2017/0102441 A1 | 4/2017 | Ganesh et al. | |
| 2017/0250623 A1 * | 8/2017 | Maly | H02M 1/088 |

OTHER PUBLICATIONS

Liu, Haiying, et al.; "True Energy-Minimal and Finite-Size Biplanar Gradient Coil Design for MRI", IEEE Transactions on Medical Imaging, pp. 826-830, vol. 17, Issue 5, Oct. 1998.
Sebate, Juan, et al.; "High-Power High-Fidelity Switching Amplifier Driving Gradient Coils for MRI Systems", Power Electronics Specialists Conference, pp. 261-266, Nov. 15, 2004.
Shvartsman, S.H., et al.; "Ultrashort Shielded Gradient Coil Design With 3D Geometry", Concepts in Magnetic Resonance, pp. 1-15, vol. 26-B, Issue 1, Jul. 15, 2005.

\* cited by examiner

*Primary Examiner* — Dixomara Vargas (57) ABSTRACT

In a magnetic resonance imaging (MRI) system, synchronized control of the operation of a gradient amplifier subsystem, a power supply subsystem, and a power distribution unit subsystem is accomplished by providing a coil command reference signal as an input to respective control blocks of the gradient amplifier subsystem, the power supply subsystem, and the power distribution unit subsystem. The coil command reference signal corresponds to a predetermined gradient coil current for at least one gradient coil of a scanner of the MRI system.

20 Claims, 6 Drawing Sheets

SYNCHRONIZED CONTROL OF POWER SUPPLY AND GRADIENT AMPLIFIER IN MRI SYSTEMS

BACKGROUND

In general, magnetic resonance imaging (MRI) examinations are based on the interactions among a primary magnetic field, a radiofrequency (RF) magnetic field, and time varying magnetic gradient fields with gyromagnetic material having nuclear spins within a subject of interest, such as a patient. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

During imaging sequences, the time varying gradient fields are generated by application of current to a series of gradient coils. The gradient coils are energized via gradient amplifiers, which are connected to a power supply. Gradient amplifiers are generally power converters having high bandwidth for controlling the gradient magnetic fields with high accuracy. Energy storage components (e.g., capacitors) are some of the key components in the circuit structure of gradient amplifiers, as they act as buffer in between the power supply and the gradient amplifier. Such energy storage components may be used to provide stored energy to inductive parts of the gradient coils. Unfortunately, energy storage components add cost, weight, and volume to gradient amplifiers. Reduction in weight and volume is one of the challenging tasks in the design of a compact gradient amplifier. Accordingly, a need exists to reduce the reliance on such energy storage components or to use such energy storage components in more efficient manner.

BRIEF DESCRIPTION

The present disclosure includes a method for synchronizing control of a magnetic resonance imaging (MRI) gradient chain. The MRI gradient chain includes a power supply and a gradient amplifier coupled to a power output of the power supply, the gradient amplifier being operably coupled to a gradient coil to energize the gradient coil with a coil current. The method includes monitoring an output electrical current and an output voltage supplied from the power supply to the gradient amplifier to generate a power supply output current feedback and a power supply output voltage feedback; monitoring the coil current supplied from the gradient amplifier to the gradient coil to generate a coil current feedback; providing a coil current reference signal to a power supply control block and to a gradient amplifier control block; providing a power supply output voltage reference signal to the power supply control block; generating a control command signal for the power supply via the power supply control block using the power supply output voltage feedback, the power supply output voltage reference, the power supply output current feedback and the coil current reference signal as inputs, the control command signal for the power supply corresponding to a required power output by the power supply to the gradient amplifier according to the coil current reference signal; and generating a control command signal for the gradient amplifier via the gradient amplifier control block using the coil current feedback and the coil current reference signal, the control command signal for the gradient amplifier corresponding to a power required to be output by the gradient amplifier to the gradient coil according to the coil current reference signal.

The present disclosure also includes a magnetic resonance imaging (MRI) system that includes a power supply configured to receive power from a power distribution unit; a gradient amplifier coupled to an output of the power supply and to a gradient coil of a scanner of the Mill system. The gradient amplifier is configured to use power received from the power supply to provide a coil current to the gradient coil and thereby generate a gradient magnetic field. The system also includes a power supply control block configured to control the power supply using a power supply control command signal; a gradient amplifier control block configured to control the gradient amplifier using a gradient amplifier control command signal; and a synchronized control platform configured to provide a synchronizing reference signal to the power supply control block and the gradient amplifier control block such that control of the power supply and the gradient amplifier is synchronized by the synchronizing reference signal.

The present disclosure also includes a magnetic resonance imaging (MRI) method performed by an MRI system. The method includes: acquiring magnetic resonance data from a subject of interest using a scanner of the MRI system, the magnetic resonance data being acquired using pulse sequences in which gradient coils of the scanner are pulsed with gradient coil currents; controlling the provision of gradient coil currents to the gradient coils by controlling operation of a gradient amplifier subsystem operably coupled to the gradient coils, a power supply subsystem configured to provide power to the gradient amplifier subsystem, and a power distribution unit subsystem configured to provide power to the power supply subsystem; and synchronizing the control of the operation of the gradient amplifier subsystem, the power supply subsystem, and the power distribution unit subsystem by providing a coil command reference signal as an input to respective control blocks of the gradient amplifier subsystem, the power supply subsystem, and the power distribution unit subsystem. The coil command reference signal corresponds to a predetermined gradient coil current for at least one of the gradient coils of the scanner.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

As set forth above, energy storage (capacitance) is one of the key factors in the circuit design of gradient amplifiers. For example, a capacitor is attached at each input dc port of a gradient amplifier, and is also connected to the output of a power supply. This energy storage provides stored energy to the gradient coil inductor during transients of high slew rate (high di/dt). In accordance with the present disclosure, it is now recognized that it is possible to reduce the required capacitance value in these energy storage elements of the gradient amplifier by synchronizing control of different subsystems of the MR gradient chain. Reducing capacitance value can be considered to allow for smaller energy storage elements, or more efficiently use such elements. In addition, the GA will still be able to ensure accurate gradient field control and will have higher power density.

In accordance with the present disclosure, synchronized control is accomplished, at least in part, by communication of a coil current reference value in real-time input to controllers for the GA and PS. The communication and control synchronization may be performed by a common control platform for the PS and GA, and in certain embodiments, the common control platform also controls a power distribution unit (PDU). For example, power supplies are connected to grid either through a low frequency transformer or another power converter at their front end. This front-end power processing is a PDU. Such a PDU has some energy storage elements connected at the output of PDU and the input of the PS. These energy storage elements may have active control.

The embodiments described herein may be implemented as at least a part of a magnetic resonance imaging (MRI) system, wherein specific imaging routines (e.g., diffusion MRI sequences) are initiated by a user (e.g., a radiologist). Thus, the MRI system may perform data acquisition, data construction, and in certain instances, image synthesis. Accordingly, referring to FIG. 1, a magnetic resonance imaging system 10 is illustrated schematically as including a scanner 12, scanner control circuitry 14, and system control circuitry 16. According to the embodiments described herein, the MRI system 10 is generally configured to perform MR imaging, such as imaging sequences for diffusion imaging.

Figure 1:
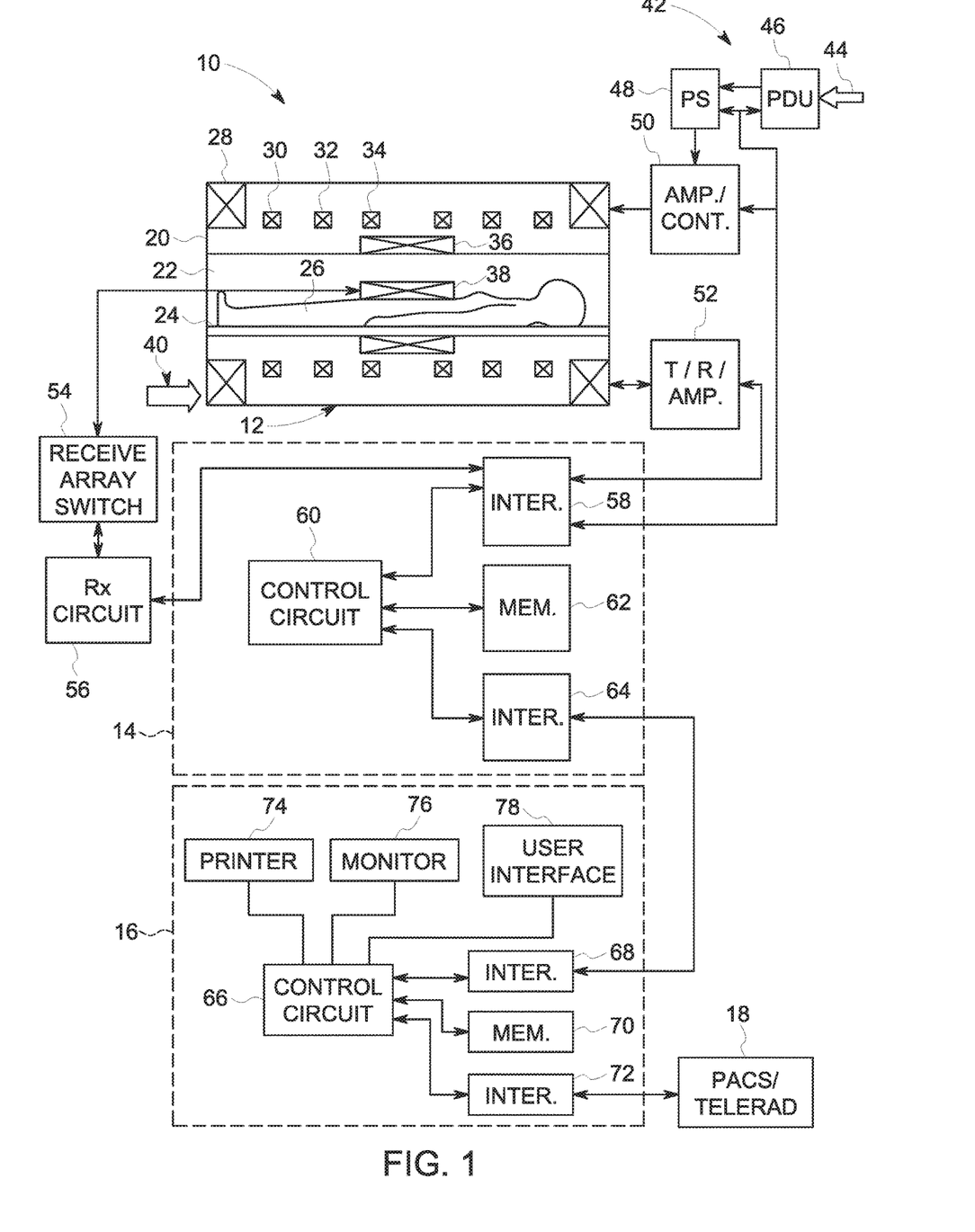
FIG. 1 illustrates an embodiment of a magnetic resonance imaging (MRI) system having a power supply and gradient amplifier having synchronized control.

System 10 additionally includes remote access and storage systems or devices such as picture archiving and communication systems (PACS) 18, or other devices such as teleradiology equipment so that data acquired by the system 10 may be accessed on- or off-site. In this way, MR data may be acquired, followed by on- or off-site processing and evaluation. While the MM system 10 may include any suitable scanner or detector, in the illustrated embodiment, the system 10 includes a full body scanner 12 having a housing 20 through which a bore 22 is formed. A table 24 is moveable into the bore 22 to permit a patient 26 to be positioned therein for imaging selected anatomy within the patient.

Scanner 12 includes a series of associated coils for producing controlled magnetic fields for exciting the gyromagnetic material within the anatomy of the subject being imaged. Specifically, a primary magnet coil 28 is provided for generating a primary magnetic field, BO, which is generally aligned with the bore 22. A series of gradient coils 30, 32, and 34 permit controlled magnetic gradient fields to be generated for positional encoding of certain of the gyromagnetic nuclei within the patient 26 during examination sequences. A radio frequency (RF) coil 36 is configured to generate radio frequency pulses for exciting the certain gyromagnetic nuclei within the patient. In addition to the coils that may be local to the scanner 12, the system 10 also includes a set of receiving coils 38 (e.g., an array of coils) configured for placement proximal (e.g., against) to the patient 26. As an example, the receiving coils 38 can include cervical/thoracic/lumbar (CTL) coils, head coils, single-sided spine coils, and so forth. Generally, the receiving coils 38 are placed close to or on top of the patient 26 so as to receive the weak RF signals (weak relative to the transmitted pulses generated by the scanner coils) that are generated by certain of the gyromagnetic nuclei within the patient 26 as they return to their relaxed state.

The various coils of system 10 are controlled by external circuitry to generate the desired field and pulses, and to read emissions from the gyromagnetic material in a controlled manner. In the illustrated embodiment, a main power supply 40 provides power to the primary field coil 28 to generate the primary magnetic field, Bo. The illustrated system 10 also includes a gradient chain 42 (an Mill gradient chain), which generally serves to power the gradient coils 30, 32, and 34 to produce the gradient magnetic fields (e.g., $G_x$, $G_y$, $G_z$). The illustrated embodiment of the gradient chain includes a power input 44 (e.g., power from a utility or grid), a power distribution unit (PDU) 46, a power supply (PS) 48, and a driver circuit 50, which together provide power to pulse the gradient field coils 30, 32, and 34. The driver circuit 50 may include amplification and control circuitry for supplying current to the coils as defined by digitized pulse sequences output by the scanner control circuit 14. As depicted, the PDU 46, the PS 48, and the driver circuit 50 (including one or more gradient amplifiers (GAs)) are connected to the scanner control circuit 14 for control synchronization, as described in further detail below.

Another control circuit 52 is provided for regulating operation of the RF coil 36. Circuit 52 includes a switching device for alternating between the active and inactive modes of operation, wherein the RF coil 36 transmits and does not transmit signals, respectively. Circuit 52 also includes amplification circuitry configured to generate the RF pulses. Similarly, the receiving coils 38 are connected to switch 54, which is capable of switching the receiving coils 38 between receiving and non-receiving modes. Thus, the receiving coils 38 resonate with the RF signals produced by relaxing gyromagnetic nuclei from within the patient 26 while in the receiving mode, and they do not resonate with RF energy from the transmitting coils (i.e., coil 36) so as to prevent undesirable operation while in the non-receiving mode. Additionally, a receiving circuit 56 is configured to receive the data detected by the receiving coils 38, and may include one or more multiplexing and/or amplification circuits.

It should be noted that while the scanner 12 and the control/amplification circuitry described above are illustrated as being coupled by a single line, that many such lines may occur in an actual instantiation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner and either or both of the scanner and system control circuitry 14, 16.

As illustrated, scanner control circuit 14 includes an interface circuit 58, which outputs signals for driving the gradient field coils and the RF coil and for receiving the data representative of the magnetic resonance signals produced in examination sequences. The interface circuit 58 is coupled to a control and analysis circuit 60. The control and analysis circuit 60 executes the commands for driving the circuit 50 and circuit 52 based on defined protocols selected via system control circuit 16. In the illustrated embodiment, the control and analysis circuit 60 of the scanner control circuitry 14 is communicatively coupled to the elements of the gradient chain 42, including the PDU 46, the PS 48, and the driver circuit 50 to accomplish control synchronization. In certain embodiments, for example, the control and analysis circuitry 60 may transmit a common reference signal to the elements of the gradient chain 42 to synchronize their control. The common reference signal may be, for instance, a coil current reference for one or more of the gradient coils. More specifically, the driver circuit 50 may include a GA for each gradient coil, and the control and analysis circuit 60 may transmit a reference current for a particular gradient coil to the gradient chain 42 as appropriate. Further details relating to such control are set forth below.

Control and analysis circuit 60 also serves to receive the magnetic resonance signals and performs subsequent processing before transmitting the data to system control circuit 16. Scanner control circuit 14 also includes one or more memory circuits 62, which store configuration parameters, pulse sequence descriptions, examination results, and so forth, during operation.

Interface circuit 64 is coupled to the control and analysis circuit 60 for exchanging data between scanner control circuit 14 and system control circuit 16. In certain embodiments, the control and analysis circuit 60, while illustrated as a single unit, may include one or more hardware devices. The system control circuit 16 includes an interface circuit 66, which receives data from the scanner control circuit 14 and transmits data and commands back to the scanner control circuit 14. The control and analysis circuit 66 may include a CPU in a multi-purpose or application specific computer or workstation. Control and analysis circuit 66 is coupled to a memory circuit 70 to store programming code for operation of the MRI system 10 and to store the processed image data for later reconstruction, display and transmission. The programming code may execute one or more algorithms that, when executed by a processor, are configured to perform reconstruction of acquired data.

An additional interface circuit 72 may be provided for exchanging image data, configuration parameters, and so forth with external system components such as remote access and storage devices 18. Finally, the system control and analysis circuit 66 may be communicatively coupled to various peripheral devices for facilitating operator interface and for producing hard copies of the reconstructed images. In the illustrated embodiment, these peripherals include a printer 74, a monitor 76, and user interface 78 including devices such as a keyboard, a mouse, a touchscreen (e.g., integrated with the monitor 76), and so forth.

Figure 2:
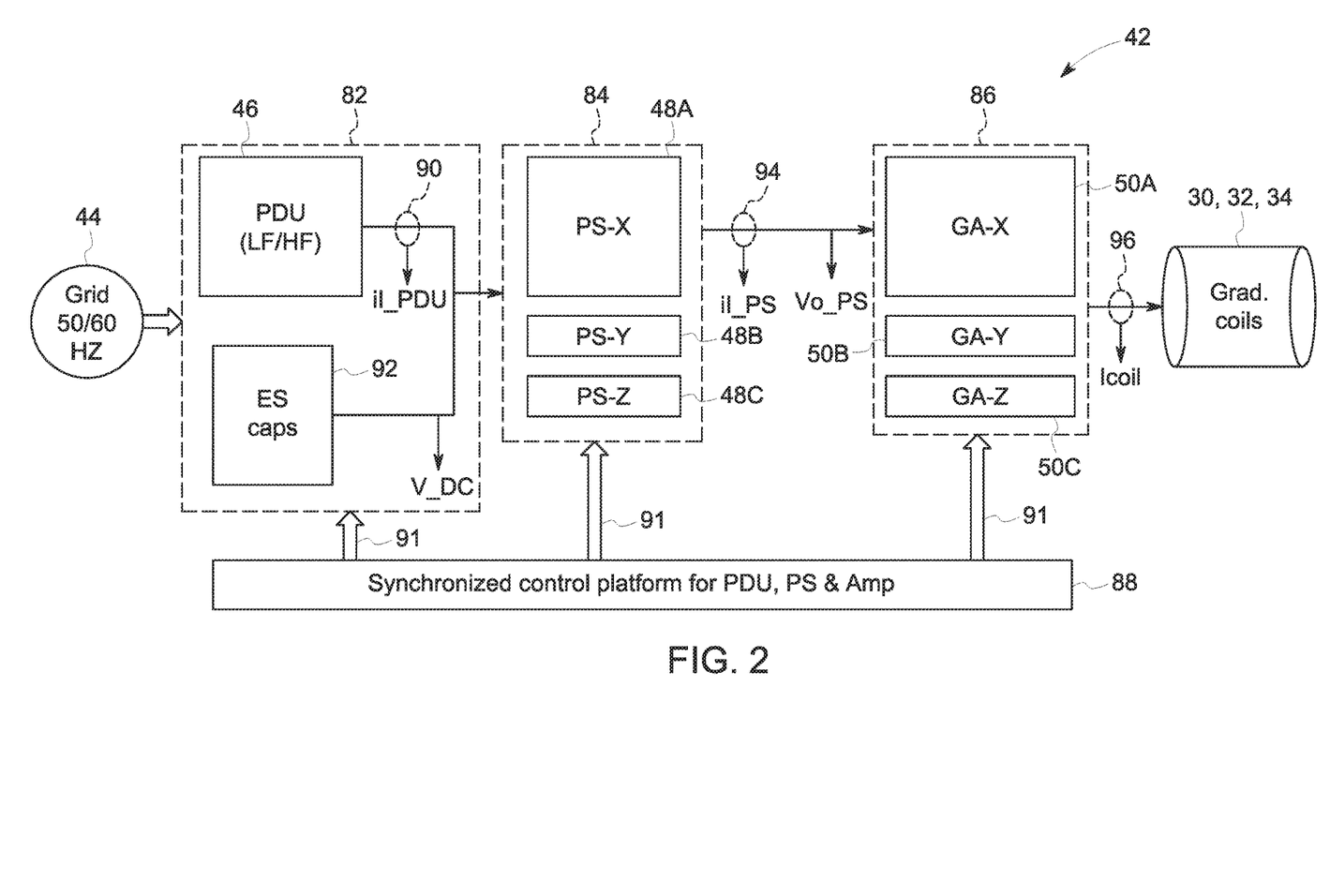
FIG. 2 illustrates an embodiment of synchronized subsystems in a gradient chain of the MRI system of FIG. 1.

A schematic diagram of an embodiment of synchronized control for the different subsystems in the gradient chain 42 of the MRI system 10 is depicted in FIG. 2. In the illustrated embodiment, the subsystems include a PDU subsystem 82, a PS subsystem 84, and a GA subsystem 86, all of which are controlled using a synchronized control platform 88. Each of these subsystems may, in certain embodiments, have their own dedicated controllers, for example proportional-integral or proportional-integral-differential controllers communicatively coupled to the synchronized control platform 88.

In accordance with the present disclosure, the synchronized control platform 88 may be implemented as, for example, a part of the scanner control circuit 60 and/or a part of the system control circuit 66. By way of non-limiting example, the scanner control circuit 60 and/or the system control circuit 66 may include one or more sets of instructions stored in memory 62 and/or memory 70, which can be executed by the respective control circuit (e.g., a corresponding one or more processors) to carry out at least a portion of the synchronized control processes described herein. For example, the synchronized control platform 88 may be at least partially implemented using one or more software packages stored in memory 62 and/or memory 70.

Additionally or alternatively, the synchronized control platform 88 may be implemented as one or more hardware controllers that can be communicatively coupled to the PDU subsystem 82, the PS subsystem 84, and the GA subsystem 86 and the scanner control circuit 60 and/or the system control circuit 66. Such hardware may include, by way of non-limiting example, appropriate input and output communication features (e.g., communication ports), as well as one or more appropriately configured controllers having memory with stored instructions or programmed logic circuits.

Power flow in the embodiment illustrated in FIG. 2 is generally from left to right. As illustrated, the PDU 46 is connected to the power input 44, in this case a power grid (utility). The PDU 46 can be either a low frequency transformer with taps on primary to serve different input voltage conditions, or it can be another power conversion stage with isolation or without isolation. In embodiments where the PDU 46 has isolation, it may include a high frequency transformer. In embodiments where the PDU 46 is implemented as a power conversion stage, the power flowing from the grid 44 may be controlled by controlling the output current of the PDU 46, as measured by a PDU output current sensor 90, the PDU output inductor current being denoted in FIG. 2 as Il_PDU.

Control of the PDU output may be performed based on a synchronizing reference signal 91, which in addition to being provided to the PDU subsystem 82, is also provided to the PS subsystem 84 and the GA subsystem 86. In certain embodiments, the synchronizing reference signal is a target driving current (e.g., a current command signal) for one or more of the gradient coils 30, 32, 34.

In the embodiment of FIG. 2, the PDU subsystem 82 includes an energy storage block 92 denoted as "ES caps," which represents one or more passive capacitance elements (capacitors). A DC-link voltage (V_DC) of the PDU subsystem 82 is controlled by a PDU converter (where present), or depends on load and grid conditions. In such embodiments, the PDU converter may be communicatively coupled to the synchronized control platform 88 to receive, for example, a reference signal for synchronization with the PS subsystem 84 and the GA subsystem 86.

It should be noted that in certain systems, the PDU 46 may be an uncontrolled low frequency transformer, and may therefore not be a part of the synchronized control schemes described herein. In other words, certain embodiments of the present disclosure may synchronize control of the PS subsystem 84 and the GA subsystem 86, without control of the PDU 46.

As shown in FIG. 2, the PS subsystem 84 includes different boxes depicting a power supply for each of the gradient coils 30, 32, 34. Specifically, the PS subsystem 84 includes a first power supply 48A for the X-gradient field coil 30 (denoted as PS-X), a second power supply 48B for the Y-gradient field coil 32 (denoted as PS-Y), and a third power supply 48C for the Z-gradient field coil 34 (denoted as PS-Z).

The output of the PS subsystem 84, which may be a single output or multiple isolated outputs from each power supply 48, is provided as an input to the GA subsystem 86. The output of the PS subsystem 84 may be controlled based on the synchronizing reference signal 91 provided by the synchronized control platform 88, the measured output voltage of the PS subsystem 84 (denoted as Vo_PS, as a feedback control component), and the current through an output inductor of the PS subsystem 84 (Il_PS, as a feedback control component). For example, Il_PS may be measured by a PS output inductor current sensor 94. In certain embodiments, there may be a respective PS output current sensor associated with each of the power supplies 48 to measure their individual output.

The illustrated GA subsystem 86 includes, among other things, a first gradient field amplifier 50A for the X-gradient field coil 30 (denoted as GA-X), a second gradient amplifier 50B for the Y-gradient field coil 32 (denoted as GA-Y), and a third gradient amplifier 50C for the Z-gradient field coil 34 (denoted as GA-Z). The gradient amplifiers 50 receive power from the power supplies 48, and control driving currents of the gradient coils 30, 32, 34 during imaging pulse sequences.

The output from each gradient amplifier 50, denoted in FIG. 2 as Icoil, is measured by a respective GA output coil current sensor 96. The respective outputs of the gradient amplifiers 50 may each be controlled using Icoil as feedback, in addition to the synchronizing reference signal 91.

Figure 3:
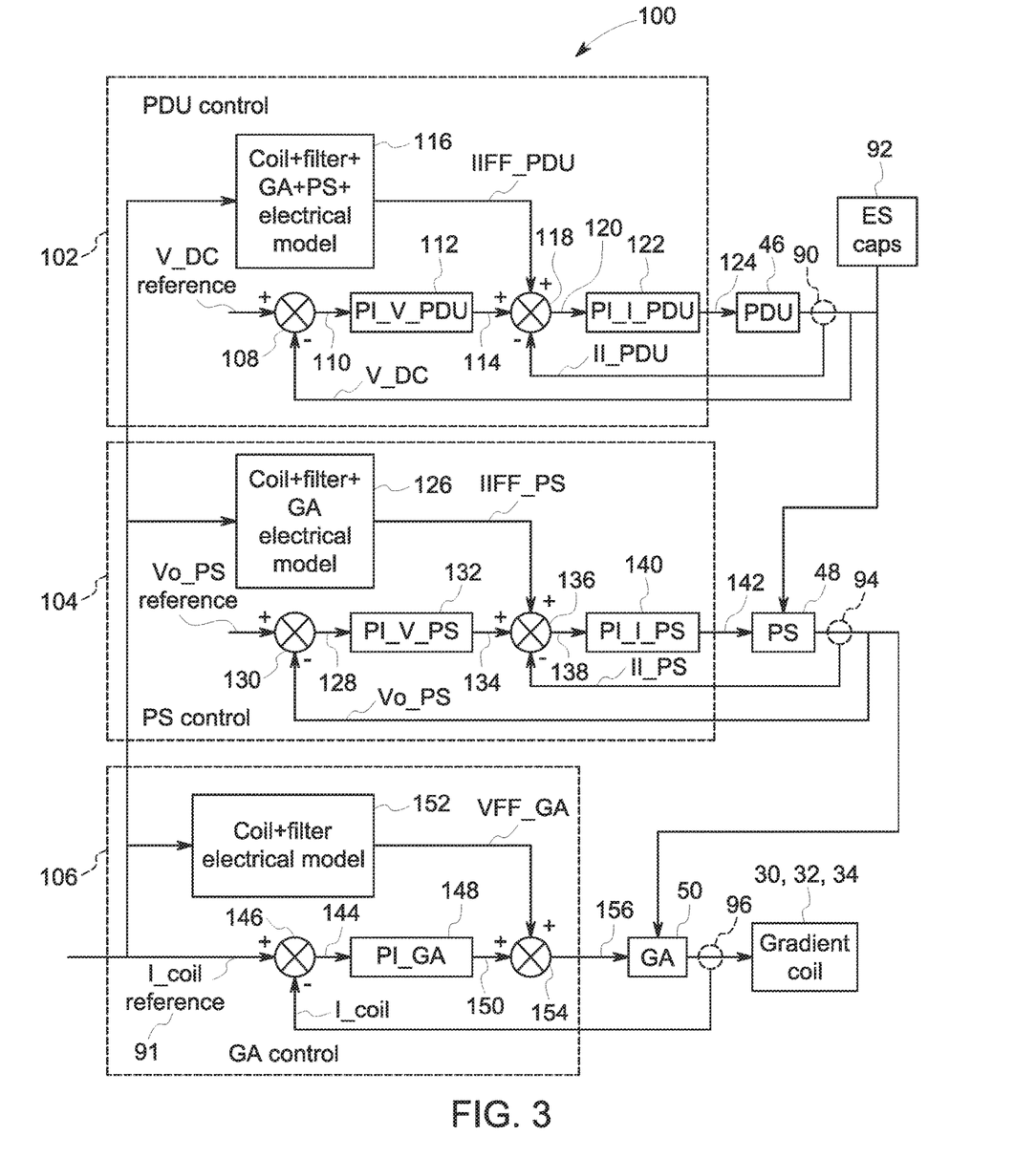
FIG. 3 illustrates an embodiment of a control scheme for synchronizing control of the power distribution unit (PDU), power supply (PS), and gradient amplifier (GA) of FIG. 2.

An embodiment of a control scheme 100 to synchronize control of the PDU 46, the PS 48, and the GA 50 is shown schematically in FIG. 3. Specifically, the control scheme 100 is shown for a single gradient amplifier providing current to a single gradient coil of the MM system 10. However, it should be noted that the illustrated control scheme 100 may be performed for the gradient coils 30, 32, 34 in combination. As shown in the control scheme 100, power is provided by the PDU 46 and the energy storage capacitors 92 to the PS 48, which in turn provides a power output to the GA 50, which powers the gradient coil 30, 32, 34. Accordingly, the lines illustrated between the ES caps 92, the PDU 46, the PS 48, and the GA 50 are generally representative of high voltage high power connections between power converters, passive elements, or inductive loads. Lines extending from these power transmission lines are feedback lines (e.g., lines from a sensor) that are provided to control blocks, as discussed below.

The control scheme 100 includes a PDU control block 102, a PS control block 104, and a GA control block 106. Control features associated with each of the control blocks may be implemented, for example, at least partially within the scanner control circuit 60 and its associated memory 62, the system control circuit 66 and its associated memory 70, and controllers within the gradient chain 42 as discussed below.

The illustrated control scheme uses the synchronizing reference signal 91, in this embodiment an Icoil reference signal or a coil current reference signal (e.g., a target signal for the current provided to the gradient coil 30, 32, 34), as an input to each of the control blocks 102, 104, 106. For example, the synchronizing reference signal 91 may be provided to an electrical model of each of the control blocks 102, 104, 106 to generate feed forward control input used to control the respective output of the PDU 46, the PS 48, and the GA 50. This signal is a command signal which comes from a host computer or computing system (e.g., the scanner control circuit 60 and/or system control circuit 66), where the particular sequence of pulses, etc., may be selected by either an operator or a radiologist to perform a given scan. The electrical models of each of the control blocks 102, 104, 106 may be, for example, electrical models stored on memory 62 and/or memory 70. Feedforward inputs generated from the electrical models may be provided to respective controllers (e.g., logic circuits) associated with the particular portion of the gradient chain 42 (e.g., the PDU 46, the PS 48, or the GA 50).

Further, the operations described herein in which signals are combined, subtracted, and so forth, may be performed, by way of example, using logic circuits and/or using software associated with the scanner control circuit 60 and/or the system control circuit 66. Additionally or alternatively, the operations described herein may be implemented using logic circuits associated with the particular feature of the gradient chain 42 (e.g., the PDU 46, the PS 48, or the GA 50).

Referring now to the PDU control block 102, V_DC reference is a setpoint value for the voltage output of the PDU 46 (e.g., a voltage reference signal for the power distribution unit 46), and V_DC is a feedback signal of the output DC voltage of the PDU 46 (e.g., a voltage feedback signal for the PDU 46). Operation 108 determines a voltage error signal 110 between the V_DC reference and the V_DC feedback signal. The error signal 110 goes to a PDU voltage controller 112 (denoted as PI_V_PDU), which may be implemented as a proportional integral (PI) controller associated with the PDU 46. The PDU voltage controller 112 produces a PDU feedback-derived control signal 114 using the error signal 110.

A feedforward control signal (IFF_PDU), which is calculated in real time from an electrical model 116 of a gradient amplifier filter, the coil 30, 32, 34, the GA 50, and the PS 48, is added to the PDU feedback-derived control signal 114 at an operation 118. Operation 118 also subtracts a current feedback signal (Il_PDU, generated by current sensor 90) from the sum of the PDU feedback-derived control signal 114 and the IFF_PDU signal to thereby produce a current error signal 120. The Il_PDU feedback signal is an output inductor current in embodiments where the PDU 46 is an isolated high frequency PDU. In embodiments where the PDU 46 is non-isolated, Il_PDU may be an equivalent input current of the PDU 46. The current error signal 120 goes to a PDU current controller 122 (PI_I_PDU), which may be implemented as a proportional integral (PI) controller associated with the PDU 46. The PDU current controller 122 uses the current error signal 120 to derive a PDU control command signal 124 that is indicative of a voltage required by the system to be produced by the power converter of the PDU 46.

As shown, the ES caps 92 and the PDU 46 provide a power output to the input of the PS 48. As noted above, control of the PS 48 is also done using the Icoil reference signal 91, which is provided to an electrical model 126 of the gradient coil 30, 32, 34, gradient amplifier filter, and gradient amplifier 50. The electrical model 126 outputs a feedforward control signal for the PS 48 (IFF PS), which is processed as discussed below.

The PS control block 104 also uses a Vo_PS reference signal as an input, which is a set point value for the output voltage of the PS 48 (e.g., a voltage reference signal for the PS 48 corresponding to a target voltage at an output of the PS 48). A voltage feedback signal for the output voltage of the PS 48 (Vo_PS) and the Vo_PS signal are used to produce an error signal 128 at operation 130. For example, a difference between the Vo_PS feedback signal and the Vo_PS reference signal may correspond to the error signal 128. In embodiments where there are multiple ports for the PS 48, the Vo_PS feedback signal may be a function of the individual output voltages for the ports (e.g., a weighted sum or similar function).

The error signal 128 may be used as an input to a PS voltage controller 132 (PI_V_PS), which is configured to produce a PS feedback-derived control signal 134 for the PS 48. In the PS control block 104, the PS feedback-derived control signal 134 is added with the feedforward control signal IFF PS (e.g., a feedforward current control signal), which is calculated in real time from the electrical model 126, at operation 136. The PS voltage controller 132 may be implemented, for example, as a PI controller associated with the PS 48.

A sum of the PS feedback-derived control signal 134 and the IIFF_PS signal is used to produce a current error signal 138 by subtracting a current feedback signal (Il_PS). As noted above, Il_PS is a feedback signal produced by the PS output current sensor 94, and may be an output inductor current of the PS 48. Further, in embodiments where there are multiple such current feedback signals, the actual feedback signal provided to the operation 136 is a function of these multiple currents. The current error 138 is provided to a PS current controller (PI_I_PS) 140, which is configured to produce a PS control signal 142 indicative of a voltage required by the system to be produced by the power converter of the PS 48. The PS current controller 140 may be implemented, for example, as a PI controller associated with the PS 48.

In FIG. 3, referring to the GA control block 106, the Icoil reference signal 91 and Icoil feedback signal (e.g., a coil current feedback signal) are used to generate a current error 144 at operation 146. The current error 144 is provided to a GA current controller 148 (PI_GA), which may be implemented as a proportional integral (PI) controller associated with the GA 50. The GA current controller 148 generally helps to track coil current to the coil current reference value. The output of the GA current controller 148 is a feedback-derived control signal 150, which is added to a feedforward control signal (Vff_GA) for the gradient amplifier calculated in real time from an electrical model 152 of the gradient amplifier filter, and the gradient coil 30, 32, 34. A sum of these two commands, at operation 154, form a total control command 156, indicative of a total voltage needed by the gradient coil 30, 32, 34 to be produced by the power converter of the GA 50. It should be noted that this type of control for the GA 50 helps the GA 50 to achieve high accuracy to follow the Icoil reference signal 91, to thereby minimize error between the reference signal and the actual current in the gradient coil 30, 32, 34.

Figure 4:
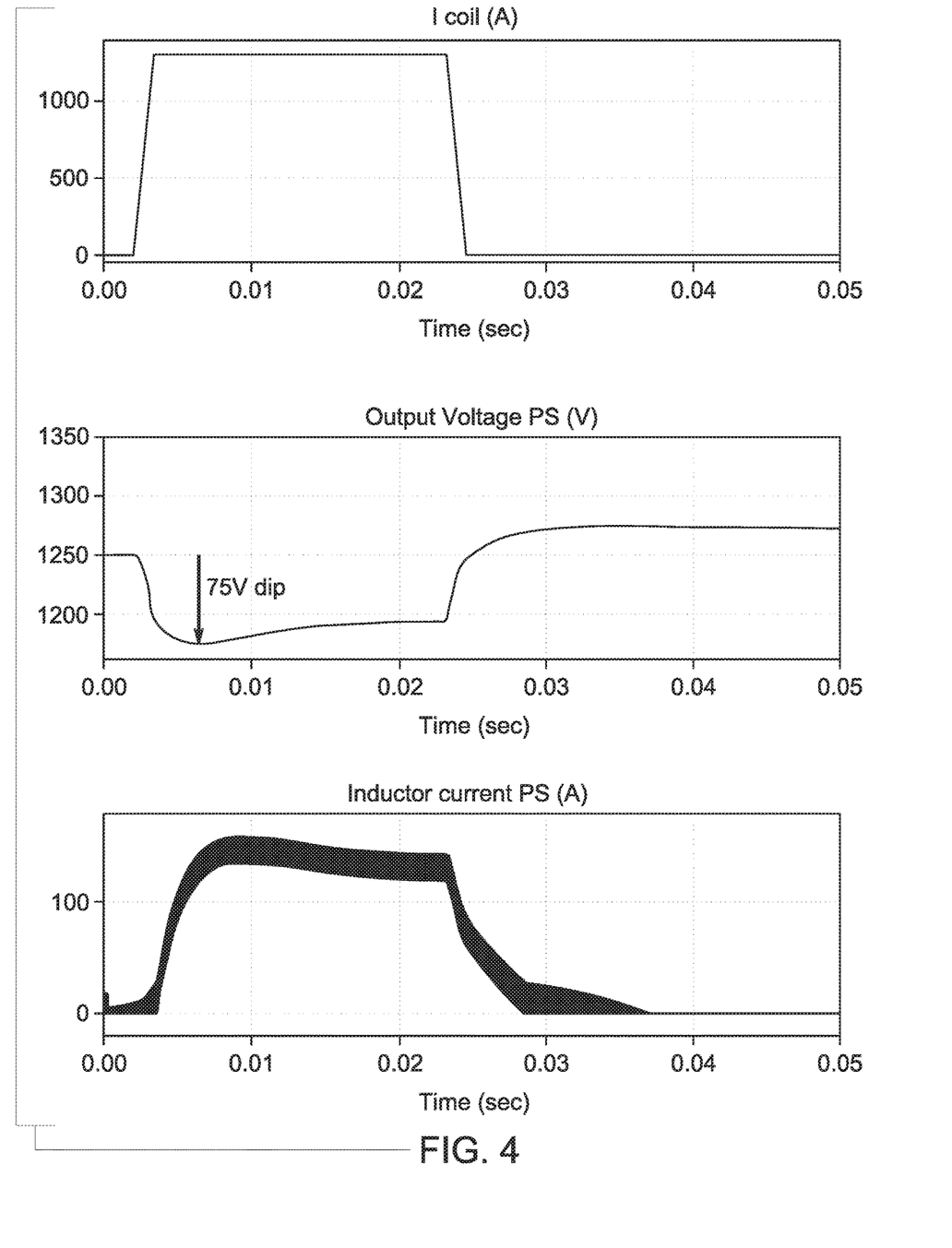
FIG. 4 illustrates a response of PS output voltage and output inductor current of PS when unsynchronized control is used for the PDU, PS, and GA of FIG. 2.
Figure 5:
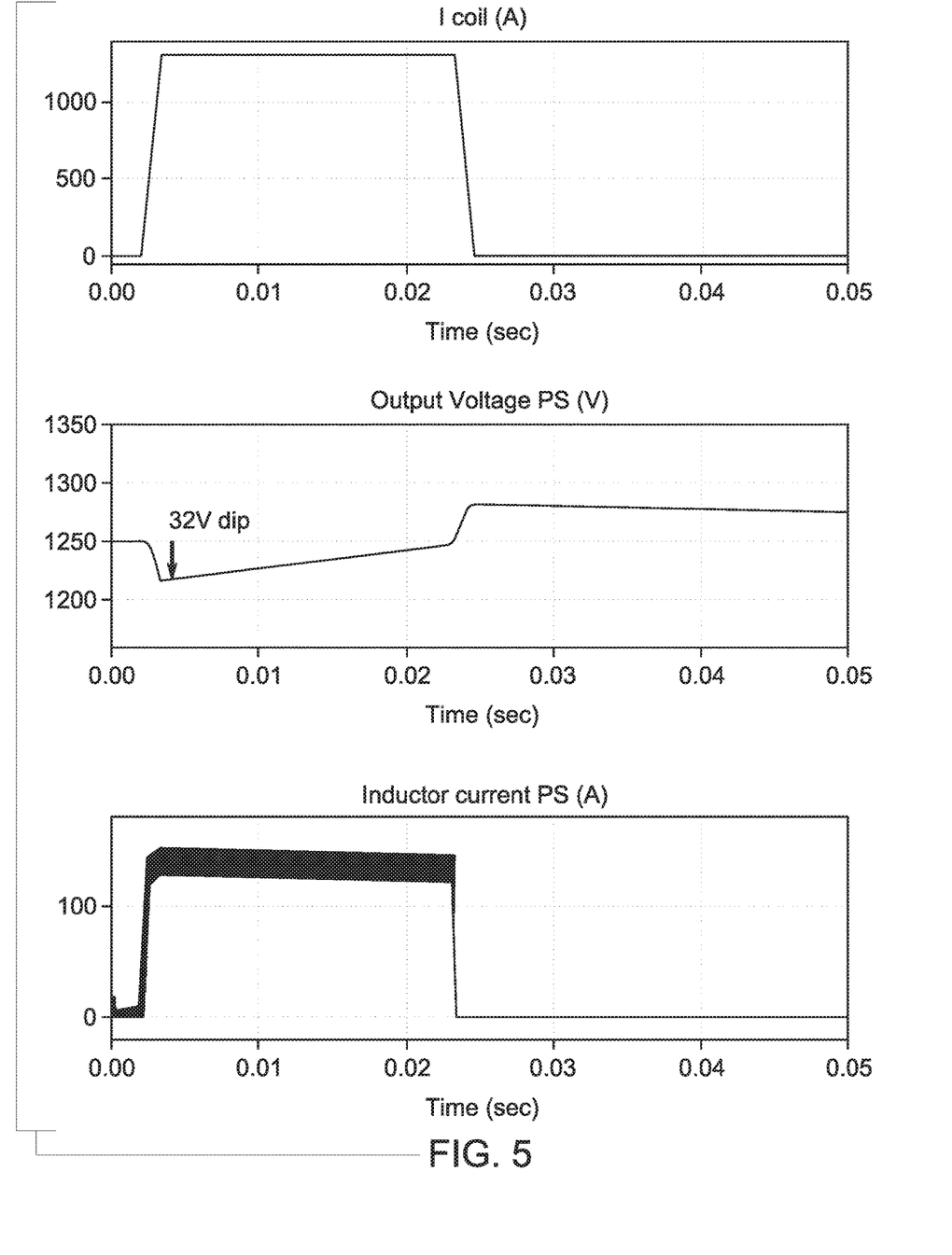
FIG. 5 illustrates a response of PS output voltage and output inductor current of PS when synchronized control is used for the PDU, PS, and GA of FIG. 2.
Figure 6:
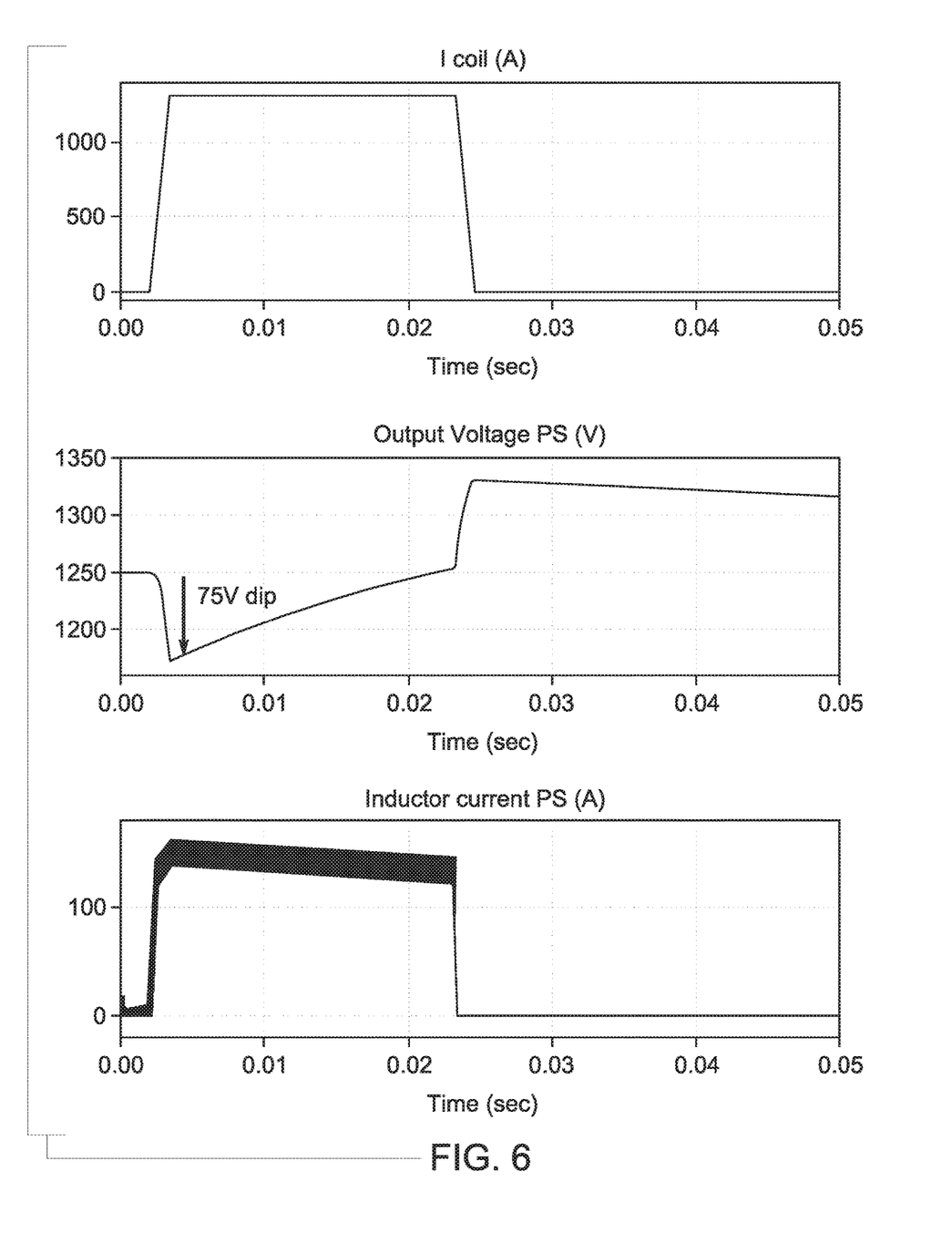
FIG. 6 illustrates a response of PS output voltage and output inductor current when synchronized control is used for the PDU, PS, and GA of FIG. 2 and reduced capacitance at the output of the PS and the input of the GA.

To demonstrate some of the effects of synchronizing control in accordance with the present disclosure, FIGS. 4-6 depict PS output voltage and output inductor current generated in response to using certain control strategies. Specifically, FIG. 4 depicts the PS output voltage and PS inductor current produced using a strategy in which the PS 48 and the GA 50 are independently controlled without synchronization. As shown, when Icoil increases from zero to 1300 A (e.g., as in a gradient pulse), a voltage dip of 75V is observed in the output voltage of the PS 48. This output voltage is connected to the input of power electronic bridge of the GA 50. To account for this voltage dip, in this particular embodiment, each DC input of the GA 50 has a total 7 mF capacitance (e.g., one or more capacitors that provide 7 mF capacitance) so that rapid pulsing of the gradient coils 30, 32, 34 can be maintained. It can also be seen in FIG. 4 that the PS inductor current profile does not rise fast enough to catch up the voltage drop of the output voltage of the PS 48.

On the other hand, FIG. 5 depicts the PS output voltage and output inductor current generated in response to using a synchronized control strategy in which control of the PS 48 and the GA 50 is synchronized using the Icoil reference signal. Here, for the same gradient coil current command (zero to 1300 A flat-top profile) as used in FIG. 4, the voltage dip in the PS output voltage is reduced to 32V, and the output inductor current ramps up very fast to reduce the voltage drop of the output voltage of the PS 48. In this embodiment, the capacitance on each DC port of the GA 50 remains 7 mF.

Because the voltage dip is significantly reduced when synchronized control is performed, the capacitance requirement in the DC link of the GA 50 may also be reduced. For the same gradient coil current command (1300 A flat-top) set forth in FIGS. 4 and 5, using 3 mF capacitance on each DC port of amplifier, the output voltage has a voltage dip of 75V. Comparing FIGS. 4 and 6, after reducing DC capacitance from 7 mF to 3 mF in the GA 50, it can be seen voltage dip in the output voltage of the PS 48 is substantially the same—meaning that synchronized control can be used to reduce capacitance requirements in the GA 50. It can also be seen that the PS inductor current profile more closely follows the Icoil current command than the PS inductor current profile shown in FIG. 4.

In view of the foregoing, it should be appreciated that a number of technical advantages and technical effects may be realized when synchronization of the control of the PDU 46, the PS 48, and the GA 50 is implemented. For example, such synchronized control allows faster control of power required by the GA 50 to meet the Icoil current command. Indeed, the control of the PS 48 does not solely depend on feedback control based on the voltage of the DC link, which is slow compared to the feedforward control scheme presented herein. Indeed, the PS 48 may be programmed with load commands and the PS 48 will be ready instantaneously to meet power requirements of the inductive load (e.g., the gradient coil 30, 32, 34). In addition, because the capacitance requirement for the gradient amplifier is reduced, the gradient amplifier may use smaller or fewer capacitors, thereby reducing their weight and volume. The control platform may also be simplified for the gradient chain 42. Due to the more efficient use of energy storage features, it is also possible to reduce a beating frequency between the power supply 48 and the gradient amplifier 50.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for synchronizing control of a magnetic resonance imaging (MM) gradient chain, the MRI gradient chain comprising a power supply and a gradient amplifier coupled to a power output of the power supply, the gradient amplifier being operably coupled to a gradient coil to energize the gradient coil with a coil current, wherein the method comprises:
   monitoring an output electrical current and an output voltage supplied from the power supply to the gradient amplifier to generate a power supply output current feedback and a power supply output voltage feedback;
   monitoring the coil current supplied from the gradient amplifier to the gradient coil to generate a coil current feedback;
   providing a coil current reference signal to a power supply control block and to a gradient amplifier control block;
   providing a power supply output voltage reference signal to the power supply control block;
   generating a control command signal for the power supply via the power supply control block using the power supply output voltage feedback, the power supply output voltage reference, the power supply output current feedback and the coil current reference signal as inputs, the control command signal for the power supply corresponding to a required power output by the power supply to the gradient amplifier according to the coil current reference signal; and
   generating a control command signal for the gradient amplifier via the gradient amplifier control block using the coil current feedback and the coil current reference signal, the control command signal for the gradient amplifier corresponding to a power required to be output by the gradient amplifier to the gradient coil according to the coil current reference signal.

2. The method of claim 1, wherein the coil current reference signal is a coil current command signal indicative of a current for the gradient coil to be energized in a predetermined manner according to a pulse pattern that creates a gradient magnetic field prescribed by an imaging sequence.

3. The method of claim 1, wherein generating the control command signal for the power supply comprises calculating a feed forward current control input for the power supply from the coil current reference signal via an electrical model of the gradient coil, a gradient amplifier filter, and the gradient amplifier.

4. The method of claim 3, wherein generating the control command signal for the power supply comprises:
   generating a voltage error signal by determining a difference between the power supply output voltage reference signal and a voltage feedback signal for the power supply, the power supply output voltage reference signal being a target voltage at an output of the power supply;
   generating a current command signal from the voltage error signal using a power supply voltage control;
   generating a current error signal by combining the current command signal and the feed forward current control input for the power supply, and subtracting the power supply output current feedback; and
   generating the control command signal for the power supply from the current error signal using a power supply current controller.

5. The method of claim 1, wherein generating the control command signal for the gradient amplifier comprises deriving a feed forward control input for the gradient amplifier from the coil current reference signal via an electrical model of the gradient coil and a gradient amplifier filter.

6. The method of claim 5, wherein generating the control command signal for the gradient amplifier comprises:
   generating a current error signal by determining a difference between the coil current reference signal and the coil current feedback;
   generating a feedback-derived control signal from the current error signal using a gradient amplifier current controller; and
   generating the control command signal for the gradient amplifier by combining the feedback-derived control signal and the feed forward control input derived from the coil current reference signal for the gradient amplifier to produce a required voltage output at the gradient coil.

7. The method of claim 1, wherein the MM gradient chain further comprises a power distribution unit configured to receive a power input from a grid or utility, and to provide power to the power supply, and wherein the method further comprises:
   monitoring an output voltage of the power supplied from the power distribution unit to the power supply to generate a power distribution unit output voltage feedback;
   sensing at least one of an output current or inductor current of the power distribution unit to generate a power distribution unit current feedback;
   providing the coil current reference signal to a power distribution unit control block; and
   generating a control command signal for the power distribution unit via the power distribution unit control block using the power distribution unit output voltage feedback, a power distribution unit output voltage reference corresponding to a target output voltage of the power distribution unit, the power distribution unit current feedback, and the coil current reference signal, the control command signal for the power distribution unit corresponding to a required power output by the power distribution unit to the power supply according to the coil current reference signal.

8. The method of claim 7, wherein generating the control command signal for the power distribution unit comprises:
   generating a voltage error signal by determining a difference between the output voltage reference signal for the power distribution unit and the power distribution unit output voltage feedback;

generating a feedback-derived control command signal from the voltage error signal using a power distribution unit voltage controller;

generating a current error signal by adding the current command signal and a feed forward control input for the power distribution unit derived from the coil current reference signal, and subtracting the power distribution unit current feedback; and generating the control command signal for the power distribution unit from the current error signal using a power distribution unit current controller.

9. A magnetic resonance imaging (MRI) system comprising:

a power supply configured to receive power from a power distribution unit;

a gradient amplifier coupled to an output of the power supply and to a gradient coil of a scanner of the MM system, wherein the gradient amplifier is configured to use power received from the power supply to provide a coil current to the gradient coil and thereby generate a gradient magnetic field;

a power supply control block configured to control the power supply using a power supply control command signal;

a gradient amplifier control block configured to control the gradient amplifier using a gradient amplifier control command signal; and a synchronized control platform configured to provide a synchronizing reference signal to the power supply control block and the gradient amplifier control block such that control of the power supply and the gradient amplifier is synchronized by the synchronizing reference signal.

10. The MRI system of claim 9, wherein the synchronizing reference signal is a coil current command signal indicative of a current for the gradient coil to be energized in a predetermined manner.

11. The MRI system of claim 10, wherein the power supply control block comprises an electrical model of the gradient coil, the gradient amplifier filter, and the gradient amplifier, and wherein the electrical model is configured to generate a feedforward control signal for the power supply from the coil current command signal.

12. The MRI system of claim 11, wherein the power supply control block comprises a power supply voltage controller configured to generate a feedback-derived control signal for the power supply from a voltage error signal produced by subtracting a power supply voltage feedback signal measured at an output of the power supply from a reference voltage for the power supply.

13. The MRI system of claim 12, wherein the power supply control block is configured to combine the feedforward control signal with the feedback-derived control signal for the power supply, and to subtract a power supply output current feedback signal to produce a power supply current error signal, and wherein the power supply control block comprises a power supply current controller configured to generate the control command signal for the power supply.

14. The MRI system of claim 10, wherein the gradient amplifier control block comprises an electrical model of the gradient coil and a gradient amplifier filter, and wherein the electrical model is configured to generate a feedforward control signal for the gradient amplifier from the coil current command signal.

15. The MRI system of claim 14, wherein the gradient amplifier control block comprises a gradient amplifier current controller, and wherein the gradient amplifier current controller is configured to generate a feedback-derived control signal from a current error signal produced by subtracting a coil current feedback signal measured at an output of the gradient amplifier from the coil current command signal.

16. The MRI system of claim 15, wherein the gradient amplifier control block is configured to combine the feedforward control signal with the coil current feedback signal to produce the gradient amplifier control command signal.

17. The MRI system of claim 9, further comprising:

a power distribution unit configured to provide a power output to the power supply; and a power distribution unit control block configured to control the power distribution unit using a power distribution unit control command signal, wherein the synchronized control platform is configured to provide the synchronizing reference signal to the power distribution unit control block such that control of the power distribution unit, the power supply, and the gradient amplifier is synchronized by the synchronizing reference signal.

18. The Mill system of claim 17, wherein the power distribution unit control block comprises a power distribution unit voltage controller configured to generate a power distribution unit feedback-derived control signal from a voltage error signal produced by subtracting a power distribution unit voltage feedback signal measured at an output of the power distribution unit from a reference voltage for the power distribution unit.

19. The Mill system of claim 18, wherein the power distribution control block comprises an electrical model of the gradient coil, a gradient amplifier filter, the gradient amplifier, and the power supply, and wherein the electrical model is configured to generate a feedforward control signal for the power distribution unit from the synchronizing reference signal, wherein the power distribution unit control block is configured to combine the feedforward control signal with the synchronizing reference signal for the power distribution unit, and to subtract a power distribution unit output current feedback signal from their sum to produce a power distribution unit current error signal, and wherein the power distribution unit control block comprises a power distribution unit current controller configured to generate the power distribution unit control command signal from the power distribution unit current error signal.

20. A magnetic resonance imaging (MRI) method performed by an Mill system, the method comprising:

acquiring magnetic resonance data from a subject of interest using a scanner of the MM system, the magnetic resonance data being acquired using pulse sequences in which gradient coils of the scanner are pulsed with gradient coil currents;

controlling the provision of gradient coil currents to the gradient coils by controlling operation of a gradient amplifier subsystem operably coupled to the gradient coils, a power supply subsystem configured to provide power to the gradient amplifier subsystem, and a power distribution unit subsystem configured to provide power to the power supply subsystem; and synchronizing the control of the operation of the gradient amplifier subsystem, the power supply subsystem, and the power distribution unit subsystem by providing a coil command reference signal as an input to respective control blocks of the gradient amplifier subsystem, the power supply subsystem, and the power distribution unit subsystem, wherein the coil command reference signal corresponds to a predetermined gradient coil current for at least one of the gradient coils of the scanner.

\* \* \* \* \*